(12) United States Patent
Im et al.

(10) Patent No.: US 9,190,457 B2
(45) Date of Patent: Nov. 17, 2015

(54) ORGANIC LIGHT-EMITTING DISPLAY DEVICE AND METHOD OF MANUFACTURING THE SAME

(75) Inventors: Ja-Hyun Im, Yongin (KR); Kwan-Hee Lee, Yongin (KR); Beom-Seok Kim, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 433 days.

(21) Appl. No.: 13/476,681

(22) Filed: May 21, 2012

(65) Prior Publication Data

US 2012/0313844 A1  Dec. 13, 2012

(30) Foreign Application Priority Data

Jun. 13, 2011  (KR) .................. 10-2011-0057028

(51) Int. Cl.
*G09G 3/30* (2006.01)
*H01L 33/60* (2010.01)
*H01L 27/32* (2006.01)
*H01L 51/52* (2006.01)

(52) U.S. Cl.
CPC .......... *H01L 27/3216* (2013.01); *H01L 27/326* (2013.01); *H01L 27/3246* (2013.01); *H01L 51/525* (2013.01)

(58) Field of Classification Search
CPC .. H01L 27/3216; H01L 51/525; H01L 27/326
See application file for complete search history.

(56) References Cited

U.S. PATENT DOCUMENTS

| | | |
|---|---|---|
| 2004/0108818 A1 | 6/2004 | Cok et al. |
| 2004/0201558 A1 | 10/2004 | Arnold et al. |
| 2005/0001542 A1 | 1/2005 | Kiguchi |
| 2007/0001584 A1* | 1/2007 | Lee et al. ............... 313/500 |
| 2008/0231554 A1 | 9/2008 | Lee |
| 2011/0050645 A1 | 3/2011 | Lee et al. |
| 2011/0147770 A1 | 6/2011 | Hwang et al. |

FOREIGN PATENT DOCUMENTS

| | | |
|---|---|---|
| KR | 2006-0045225 A | 5/2006 |
| KR | 100635507 B1 | 10/2006 |
| KR | 2006-0112965 A | 11/2006 |

* cited by examiner

*Primary Examiner* — Elmito Breval
(74) *Attorney, Agent, or Firm* — Robert E. Bushnell, Esq.

(57) ABSTRACT

An organic light-emitting display device includes a substrate, a plurality of pixel electrodes arranged in a matrix on the substrate, and an organic common layer covering the pixel electrodes. The pixel electrodes include a plurality of first pixel electrodes, a plurality of second pixel electrodes, and a plurality of third pixel electrodes. An n-th pixel column includes the second pixel electrodes and the third pixel electrodes arranged alternately, an (n+1)-th pixel column which is adjacent to the n-th pixel column includes the first pixel electrodes, and an (n+2)-th pixel column which is adjacent to the (n+1)-th pixel column includes the second pixel electrodes and the third pixel electrodes arranged alternately, wherein n is a natural number. One of the second and third pixel electrodes is disposed in the n-th pixel column in a row and the other one of the second and third pixel electrodes is disposed in the (n+2)-th pixel column in the same row.

19 Claims, 16 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 13 of Jun. 2011 and there duly assigned Serial No. 10-2011-0057028.

BACKGROUND OF THE INVENTION

1. Field of the Invention

The present invention relates to an organic light-emitting display device and a method of manufacturing the same, and more particularly, to an organic light-emitting display device including an organic common layer and a method of manufacturing the organic light-emitting display device.

2. Description of the Related Art

The rapid development of the information technology (IT) industry is dramatically increasing the use of display devices. Recently, there have been demands for display devices that are lightweight and thin, consume low power and provide high resolution. To meet these demands, liquid crystal displays or organic light-emitting displays using organic light-emitting characteristics are being developed.

In particular, organic light-emitting displays have a wider viewing angle and operate at higher speed than liquid crystal displays, and rapid technological developments are being made to meet the market demands for flexible display devices.

SUMMARY OF THE INVENTION

Aspects of the present invention provide an improved organic light-emitting display device.

Aspects of the present invention also provide an improved organic light-emitting display device which can be manufactured by a reduced number of deposition processes using fine metal masks.

Aspects of the present invention further provide an organic light-emitting display device which has a reduced defect rate caused by intrusion of an organic layer in a pixel into another pixel.

Aspects of the present invention are, however, not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display device constructed with a substrate, a plurality of pixel electrodes arranged in a matrix on the substrate, and an organic common layer covering the pixel electrodes. The pixel electrodes include a plurality of first pixel electrodes, a plurality of second pixel electrodes, and a plurality of third pixel electrodes. An n-th pixel column includes the second pixel electrodes and the third pixel electrodes arranged alternately, an (n+1)-th pixel column which is adjacent to the n-th pixel column includes the first pixel electrodes, and an (n+2)-th pixel column which is adjacent to the (n+1)-th pixel column includes the second pixel electrodes and the third pixel electrodes arranged alternately, wherein n is a natural number. One of the second and third pixel electrodes is disposed in the n-th pixel column in a row and the other one of the second and third pixel electrodes is disposed in the (n+2)-th pixel column in the same row.

According to another aspect of the present invention, there is provided a method of manufacturing an organic light-emitting display device. The method includes preparing a substrate, forming a pixel defined layer, which includes a plurality of apertures arranged in a matrix, on the substrate, placing first through third pixel electrodes in the apertures on the substrate, forming a first organic layer on each of the first pixel electrodes, forming a second organic layer on each of the second pixel electrodes, forming an organic common layer on the first organic layer, the second organic layer and each of the third pixel electrodes as a common layer, and forming a common electrode on the organic common layer. An n-th pixel column includes the second pixel electrodes and the third pixel electrodes arranged alternately, an (n+1)-th pixel column which is adjacent to the n-th pixel column includes the first pixel electrodes, and an (n+2)-th pixel column which is adjacent to the (n+1)-th pixel column includes the second pixel electrodes and the third pixel electrodes arranged alternately, wherein n is a natural number. One of the second and third pixel electrodes is disposed in the n-th pixel column in a row and the other one of the second and third pixel electrodes is disposed in the (n+2)-th pixel column in the same row.

The above and other features and advantages of the present invention will become more apparent by describing in detail exemplary embodiments thereof with reference to the attached drawings in which.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

An organic light-emitting display includes a plurality of organic layers, each containing a material that emits red, green or blue light. Each of the organic layers is formed by a deposition process using a separate fine metal mask. Therefore, a number of complicated deposition processes using fine metal masks are required.

In an organic light-emitting display, if an organic layer being deposited in a target pixel using a fine metal mask intrudes into a neighboring pixel, when the neighboring pixel emits light, the organic layer may also emit light, thus causing pixel defects.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, exemplary embodiments of the present invention will be described with reference to the attached drawings.

Figure 1:
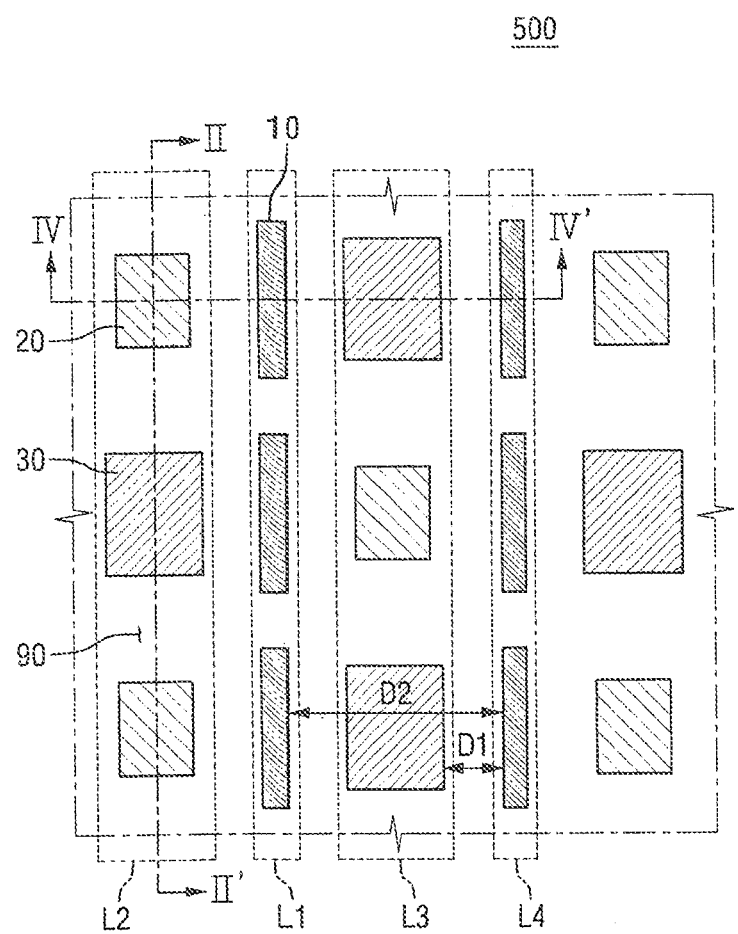
FIG. 1 is a layout view of an organic light-emitting display device constructed as an exemplary embodiment according to the principles of the present invention.
Figure 2:
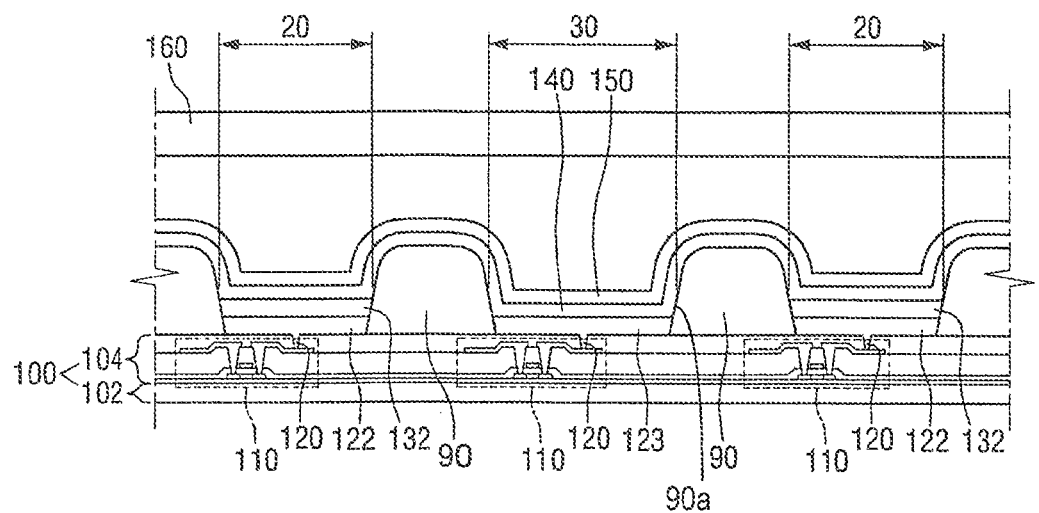
FIG. 2 is a cross-sectional view of the organic light-emitting display device of FIG. 1 taken along line II-II' of FIG. 1.
Figure 3:
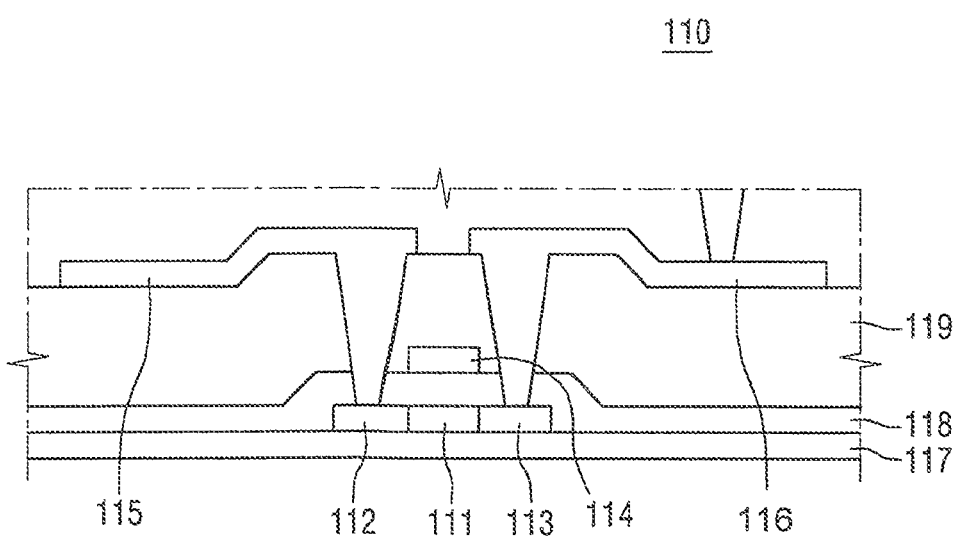
FIG. 3 is an enlarged cross-sectional view of a pixel driving portion of FIG. 1 constructed as the exemplary embodiment according to the principles of the present invention.
Figure 4:
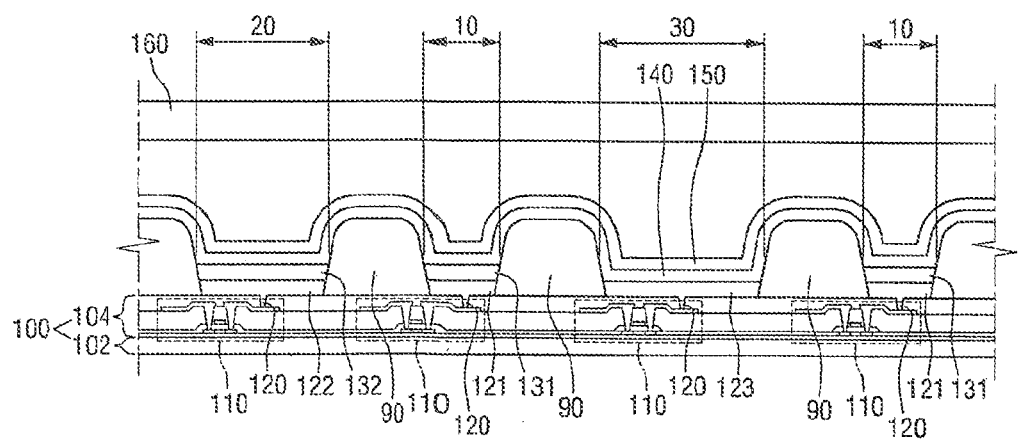
FIG. 4 is a cross-sectional view of the organic light-emitting display device of FIG. 1 taken along line IV-IV' of FIG. 1.

FIG. 1 is a layout view of an organic light-emitting display device 500 constructed as an exemplary embodiment according to the principles of the present invention. FIG. 2 is a cross-sectional view taken along line II-II' of FIG. 1. FIG. 3 is an enlarged cross-sectional view of a pixel driving portion 110 constructed as the exemplary embodiment of FIG. 1. FIG. 4 is a cross-sectional view taken along line IV-IV' of FIG. 1.

Referring to FIGS. 1 through 4, the organic light-emitting display device 500 constructed as the current exemplary embodiment according to the principles of the present invention includes a first substrate 100, a pixel defined layer 90, a plurality of pixel electrodes including first through third pixel electrodes 121 through 123, first through third organic layers 131, 132 and 140, a common electrode 150, and a second substrate 160 disposed above the common electrode 150.

The first substrate 100 includes a first insulating substrate 102 and a driving element layer 104 disposed on the first insulating substrate 102.

The first insulating substrate 102 may be a transparent insulating substrate made of glass, quartz, ceramic, or plastic. The first insulating substrate 102 may be a flat plate-shaped substrate or a flexible substrate which can be easily bent by an external force.

The driving element layer 104 is disposed on the first insulating substrate 102 and includes a plurality of pixel driving portions 110 for driving the organic light-emitting display device 500 and various wirings such as data lines. The driving element layer 104 may be formed as a single layer or a multilayer.

Each of the pixel driving portions 110 may be connected to any one of the first through third pixel electrodes 121 through 123 by a first through hole 120 and may control current supplied to the connected one of the first through third pixel electrodes 121 through 123.

More specifically, referring to FIG. 3, each of the pixel driving portions 110 may include a buffer layer 117, a semiconductor layer (111 through 113), a gate insulating film 118, an interlayer insulating film 119, a driving gate electrode 114, a driving source electrode 115, and a driving drain electrode (not shown).

The buffer layer 117 prevents penetration of impurity elements into the first substrate 100 and planarizes the surface of the first substrate 100. The buffer layer 117 may be made of various materials that can perform these functions. For example, the buffer layer 117 may be any one of a $SiN_x$ layer, a $SiO_2$ layer, and a $SiO_xN_y$ layer. The buffer layer 117 is not essential and can be omitted depending on the type of the first substrate 100 and processing conditions.

The driving semiconductor layer 111 through 113 is formed on the buffer layer 117. The driving semiconductor layer may be made of an amorphous silicon film or a polycrystalline silicon film. However, the polycrystalline silicon film is preferred. In addition, the driving semiconductor layer includes a channel region 111 which is undoped with impurities and a source region 112 and a drain region 113 which are formed on both sides of the channel region 111 and are p+-doped. Here, an ion material used to dope the source and drain regions 112 and 113 is P-type impurities such as boron (B). For example, $B_2H_6$ may be used. The impurities may vary according to the type of a thin-film transistor (TFT).

The gate insulating film 118 is formed of $SiN_x$ or $SiO_2$ on the driving semiconductor layer (111 through 113). A gate wiring including the driving gate electrode 114 is formed on the gate insulating film 118. The gate wiring further includes a gate line (not shown) and other wirings. The driving gate electrode 114 may overlap at least part (in particular, the channel region 111) of the driving semiconductor layer (111 through 113).

The interlayer insulating film 119 covering the driving gate electrode 114 is formed on the gate insulating film 118. Through holes penetrate both the gate insulating filth 118 and the interlayer insulating film 119 to expose the source region 112 and the drain region 113 of the driving semiconductor layer. Like the gate insulating film 118, the interlayer insulating film 119 may be made of $SiN_x$ or $SiO_2$.

A data wiring including the driving source electrode 115 and the driving drain electrode 116 is formed on the interlayer insulating film 119. The data wiring further includes a data line (not shown), a common power supply line (not shown), and other wirings. The driving source electrode 115 and the driving drain electrode 116 may be connected to the source region 112 and the drain region 113 of the driving semiconductor layer by the through holes, respectively.

The pixel defined layer 90 is formed on the driving element layer 104. The pixel defined layer 90 may include a plurality of apertures 90a arranged in a matrix. A pixel region is defined in each of the apertures. That is, the pixel defined layer 90 defines a plurality of pixel regions, and the pixel regions are separated from each other by the pixel defined layer 90.

The pixel regions may include first through third pixel regions 10 through 30 which emit light of different colors. In the current exemplary embodiment, the first pixel regions 10 are regions which emit green light, the second pixel regions 20 are regions which emit red light, and the third pixel regions 30 are regions which emit blue light. In each of the apertures, any one of the first through third pixel electrodes 121 through 123, which will be described later, may be placed. For example, the first pixel electrode 121 may be disposed in an aperture that defines each of the first pixel regions 10, the second pixel electrode 122 may be disposed in an aperture that defines each of the second pixel regions 122, and the third pixel electrode 123 may be disposed in an aperture that defines each of the third pixel regions 30.

Each of the first pixel regions 10 may include the first organic layer 131 formed on the first pixel electrode 121 and the third organic layer 140 formed on the first organic layer 131, in addition to the first pixel electrode 121.

Each of the second pixel regions 20 may include the second organic layer 132 formed on the second pixel electrode 122 and the third organic layer 140 formed on the second organic layer 132, in addition to the second pixel electrode 122.

Each of the third pixel regions 30 may include the third organic layer 140 formed on the third pixel electrode 123, in addition to the third pixel electrode 123.

The first through third pixel electrodes 121 through 123 may be situated on the first substrate 100 and may be connected to the driving drain electrode 116 of each of the pixel driving portions 110 by the first through hole 120. The first through third pixel electrodes 121 through 123 may be made of a reflective conductive material, a transparent conductive material, or a semi-transparent conductive material.

Examples of the reflective conductive material include Li, Ca, LiF/Ca, LiF/Al, Al, Ag, Mg, and Au. Examples of the transparent conductive material include indium tin oxide (ITO), indium zinc oxide (IZO), ZnO, and indium oxide ($In_2O_3$).

The semi-transparent conductive material may be a co-deposition material containing one or more of Mg and Ag or may be one or more of Mg, Ag, Ca, Li, and Al.

The first organic layer 131 is disposed on the first pixel electrode 121, the second organic layer 132 is disposed on the second pixel electrode 122, and the third organic layer 140 is disposed on the first organic layer 131, the second organic layer 132, the third pixel electrode 123, and the pixel defined layer 90 as a common layer.

Since the third organic layer 140 is an organic common layer disposed on the first organic layer 131, the second organic layer 132, the third pixel electrode 123 and the pixel defined layer 90, no fine metal mask is required to deposit the third organic layer 140. Accordingly, the number of fine metal masks can be reduced.

In each of the first through third organic layers 131, 132 and 140, holes and electrons generated by the common electrode 150 and one of the first through third pixel electrodes 121 through 123 combine together to form excitons. As an energy level of the excitons transits from an excited state to a ground state, each of the first through third organic layers 131, 132 and 140 emits light of a color corresponding to the changed energy level.

In some embodiments according to the principles of the present invention, the first organic layer 131 may contain a material that can emit red light, the second organic layer 132 may contain a material that can emit green light, and the third organic layer 140 may contain a material that can emit blue light. In some other embodiments of the present invention, the first organic layer 131 may contain a material that can emit green light, the second organic layer 132 may contain a material that can emit red light, and the third organic layer 140 may contain a material that can emit blue light.

A highest occupied molecular orbital (HOMO) value of the third organic layer 140 may be higher than those of the first organic layer 131 and the second organic layer 132. Thus, holes of the first organic layer 131 or the second organic layer 132 are not transported to the third organic layer 140. Accordingly, the combination of holes and electrons may not occur in regions of the third organic layer 140 which are included in the first and second pixel regions 10 and 20. As a result, regions of the third organic layer 140 which overlap the first pixel electrodes 121 or the second pixel electrode 122 may not emit light.

Although not shown in the drawings, in some embodiments of the present invention, a hole transport layer may be interposed between the first organic layer 131 and the first pixel electrode 121, between the second organic layer 132 and the second pixel electrode 122, and between the third organic layer 140 and the third pixel electrode 123. In addition, a hole injection layer may further be interposed between the hole transport layer and each of the first through third pixel electrodes 121 through 123.

Although not shown in the drawings, in some embodiments of the present invention, a hole stop layer may be interposed between each of the first through third organic layers 131, 132 and 140 and the common electrode 150. The hole stop layer between the first organic layer 131 and the common electrode 150 or between the second organic layer 132 and the common electrode 150 can be omitted when the third organic layer 140 has a higher HOMO value than the first organic layer 131 or the second organic layer 132.

The common electrode 150 is formed on the third organic layer 140, and a potential applied to the common electrode 150 may form a potential difference between the common electrode 150 and one of the first through third pixel electrodes 121 through 123.

The common electrode 150 may be made of a reflective conductive material, a transparent conductive material, or a semi-transparent conductive material.

Examples of the reflective conductive material include Li, Ca, LiF/Ca, LiF/Al, Al, Ag, Mg, and Au. Examples of the transparent conductive material include ITO, IZO, ZnO, and $In_2O_3$.

The semi-transparent conductive material may be a co-deposition material containing one or more of Mg and Ag or may be one or more of Mg, Ag, Ca, Li, and Al.

The second substrate 160 is disposed on the common electrode 150 to face the first substrate 100 and seals the first organic layer 131, the second organic layer 132 and the third organic layer 140 between the first substrate 100 and the second substrate 160 from external air. Accordingly, the present invention may further include a sealing member (not shown) which bonds and seals the first substrate 100 and the second substrate 160 together. The sealing member (not shown) may be made of one or more materials selected from the group consisting of acrylic resin, methacrylic resin, polyisoprene, vinyl resin, epoxy resin, urethane resin, and cellulose resin.

The arrangement of a plurality of pixel regions of the organic light-emitting display device 500 as the current exemplary embodiment according to the principles of the present invention will now be described with reference to FIG. 1.

Referring to FIG. 1, a plurality of pixel regions may be arranged in first through fourth pixel columns L1 through L4 which are parallel to each other along a column direction.

The first pixel column L1 and the fourth pixel column L4 may include the first pixel regions 10 arranged successively. That is, in the first pixel column L1 and the fourth pixel column L4, each of the first pixel regions 10 may neighbor different first pixel regions 10 respectively on both sides thereof in the column direction. The second pixel column L2 may include the second pixel regions 20 and the third pixel regions 30 arranged alternately. The third pixel column L3 may include the second pixel regions 20 and the third pixel regions 30 arranged alternately in an order opposite to the order in which they are arranged in the second pixel column L2.

In a row direction, each of the first pixel regions 10 may neighbor one of the second pixel regions 20 on a side thereof and may neighbor one of the third pixel regions 30 on the other side thereof. Each of the second pixel regions 20 may neighbor the first pixel regions 10 respectively on both sides thereof in the row direction and may neighbor the third pixel regions 30 respectively on both sides thereof in the column direction. Each of the third pixel regions 30 may neighbor the first pixel regions 10 respectively on both sides thereof in the row direction and may neighbor the second pixel regions 20 respectively on both sides thereof in the column direction.

In summary, the second pixel column L2, the first pixel column L1, the third pixel column L3 and the fourth pixel column L4 may be sequentially arranged in this order along the row direction, and the arrangement of a plurality of pixels may be a repetition of the arrangement of the second pixel column L2, the first pixel column L1, the third pixel column L3 and the fourth pixel column L4 in this order in the row direction.

Figure 5:
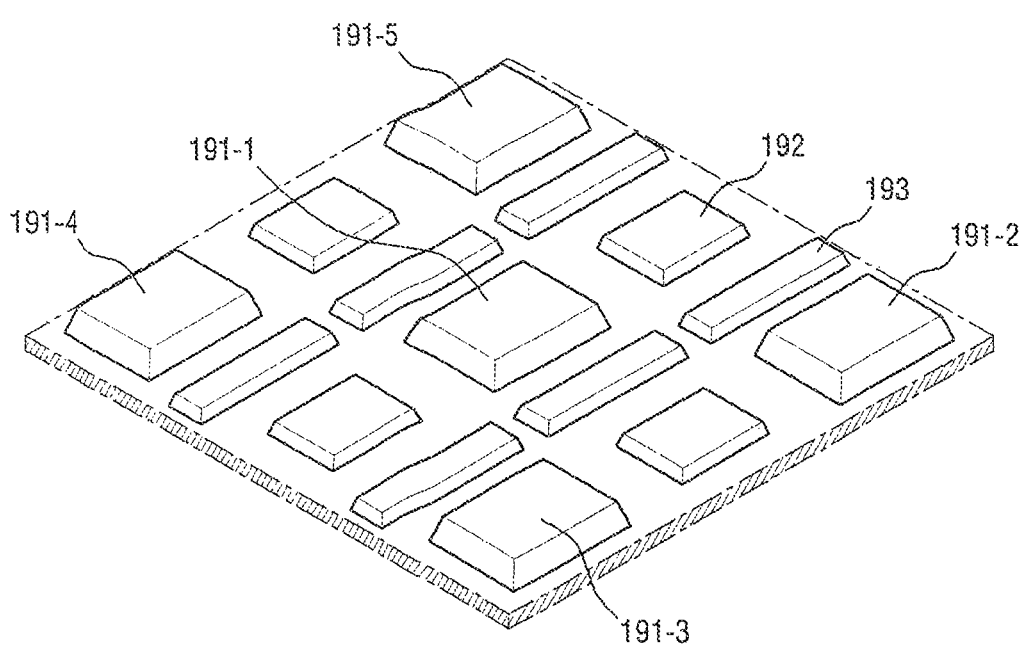
FIG. 5 is a bottom perspective view of a portion of an organic common layer of FIG. 1 constructed as the exemplary embodiment according to the principles of the present invention.

FIG. 5 is a bottom perspective view of a portion of the organic common layer (i.e., the third organic layer 140) according to the exemplary embodiment of FIG. 1.

Referring to FIGS. 1 through 5, the third organic layer 140 includes first through fifth protruding patterns 191-1 through 191-5, each corresponding to the third pixel electrode 123. The first through fifth protruding patterns 191-1 through 191-5, each corresponding to the third pixel electrode 123, protrude further than regions 193, each corresponding to the first pixel electrode 121, and regions 192, each corresponding to the second pixel electrode 122. Specifically, each of the first pixel regions 10 includes the first organic layer 131 in addition to the third organic layer 140, and each of the second pixel regions 20 includes the second organic layer 132 in addition to the third organic layer 140. On the other hand, each of the third pixel regions 30 does not include another organic layer in addition to the third organic layer 140. Thus, the first through fifth protruding patterns 191-1 through 191-5 of the third organic layer 140 in each of the third pixel regions 30 may protrude further toward the first substrate 100 than the regions 193, each corresponding to the first pixel electrode 121, by a thickness of the first organic layer 131, and may protrude further toward the first substrate 100 than the regions 192, each corresponding to the second pixel electrode 192, by a thickness of the second organic layer 132.

Each of the first through fifth protruding patterns 191-1 through 191-5 is disposed on the third pixel electrode 123. Each of the first through fifth protruding patterns 191-1 through 191-5 and the third organic layer 140 which is disposed on each of the first through fifth protruding patterns 191-1 through 191-5 may be made to emit light by a potential applied to the third pixel electrode 123 and a potential applied to the common electrode 150.

The first protruding pattern 191-1 may be located at an equal distance from each of the neighboring second through fifth protruding patterns 191-2 through 191-5. In addition, the second protruding pattern 191-2, the first protruding pattern 191-1 and the fourth protruding pattern 191-4 may be located in a straight line, and the third protruding pattern 191-3, the first protruding pattern 191-1 and the fifth protruding pattern 191-5 may be located in another straight line.

Figure 6:
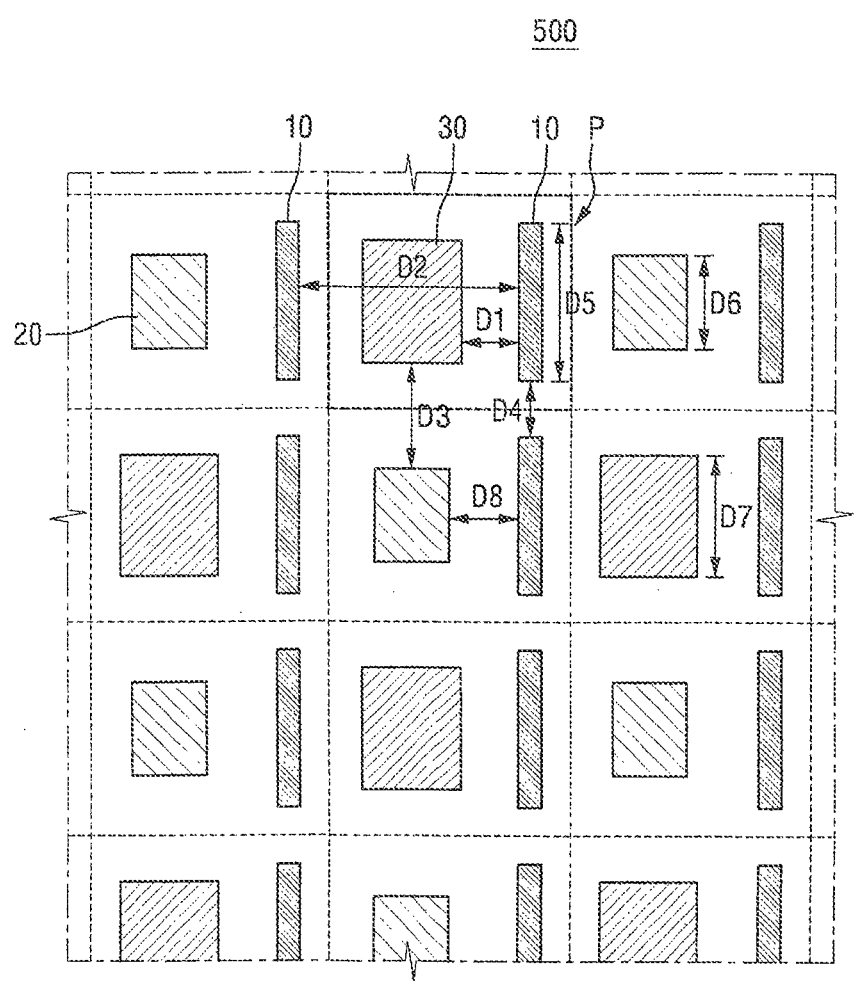
FIG. 6 is a layout view of the organic light-emitting display device of FIG. 1 constructed as the exemplary embodiment according to the principles of the present invention.

With reference to FIG. 6, a detailed description will hereinafter be given of the reason why the probability that the first or second organic layer 131 or 132 being deposited will intrude into each of the third pixel regions 30 in the organic light-emitting display device 500 constructed as the current exemplary embodiment is reduced.

FIG. 6 is a layout view of the organic light-emitting display device 500 of FIG. 1 constructed as the exemplary embodiment according to the principles of the present invention.

The resolution of a display device denotes the number of main pixels, each being a minimum unit that can display a desired color. Therefore, the area occupied by one main pixel is limited in order to obtain the same resolution in the same area.

Referring to FIG. 6, in the organic light-emitting display device 500, the first pixel regions 10 are placed in all main pixels P, respectively, and one of the second pixel regions 20 or one of the third pixel regions 30 is placed in one main pixel P. Therefore, only two pixels are included in one main pixel P. The color of light emitted from each of the first pixel regions 10 included in all main pixels P is a color to which human vision is sensitive at high resolution. When the color of one main pixel P is corrected by that of the second pixel region 20 or the third pixel region 30 included in a neighboring main pixel P, even if only two pixels are included in one main pixel P, a desired color can be expressed. Therefore, the same resolution can be obtained in the same area by using a smaller number of pixels, compared with a conventional display device in which three red, green and blue pixels are included in one main pixel.

In order to prevent a non-emitting region of a display device from being seen, a ratio of the total area of pixels in one main pixel P to the area of the main pixel P may be maintained at a predetermined value or higher. In the conventional display device in which three red, green and blue pixels are included in one main pixel, two sections are required between the pixels. However, in the organic light-emitting display device 500 constructed as the current exemplary embodiment, since only two pixels are included in one main pixel P, there is only one section between the pixels. Therefore, even when the ratio of the total area of pixels in one main pixel P to the area of the main pixel P is maintained at the predetermined value or higher, the distance between the pixels in the row direction may be greater than that in the conventional display device. Therefore, since the distance between each of the third pixel regions 30 and one of the first pixel regions 10 which neighbors the third pixel region 30 in the row direction is increased compared with that in the conventional display device, when the first organic layer 131 is deposited in each of the first pixel regions 10 using a fine metal mask, the probability that the first organic layer 131 will intrude into each of the third pixel regions 30 is reduced, thereby reducing a pixel defect rate.

Even when the ratio of the total area of pixels in one main pixel P to the area of the main pixel P is maintained at the predetermined value, a distance D8 between a second pixel region 20 and a first pixel region 10 in a main pixel P may be greater than the distance between pixels in a main pixel of the conventional display device, and a length D6 of the second pixel region 20 in the column direction may be shorter than a length D5 of the first pixel region 10 in the column direction. Likewise, a distance D1 between a third pixel region 30 and a first pixel region 10 in a main pixel P may be greater than the distance between pixels in a main pixel of the conventional display device, and the length D7 of the third pixel region 30 in the column direction may be shorter than the length D5 of the first pixel region 10 in the column direction. Accordingly, a distance D3 between each of the third pixel regions 30 and one of the second pixel regions 20 which neighbors the third pixel region 30 in the column direction is greater than that in the conventional display device. Thus, when the second organic layer 132 is deposited in each of the second pixel regions 20 using a fine metal mask, the probability that the second organic layer 132 will intrude into each of the third pixel regions 30 is reduced, thereby reducing the pixel defect rate.

In some embodiment according to the principles of the present invention, a distance D3 between each of the second pixel regions 20 and one of the third pixel regions 30 which neighbors the second pixel region 20 is smaller than a distance D1 between each of the third pixel regions 30 and one of the first pixel regions 10 which neighbors the third pixel region 30 in a column direction.

Figure 7:
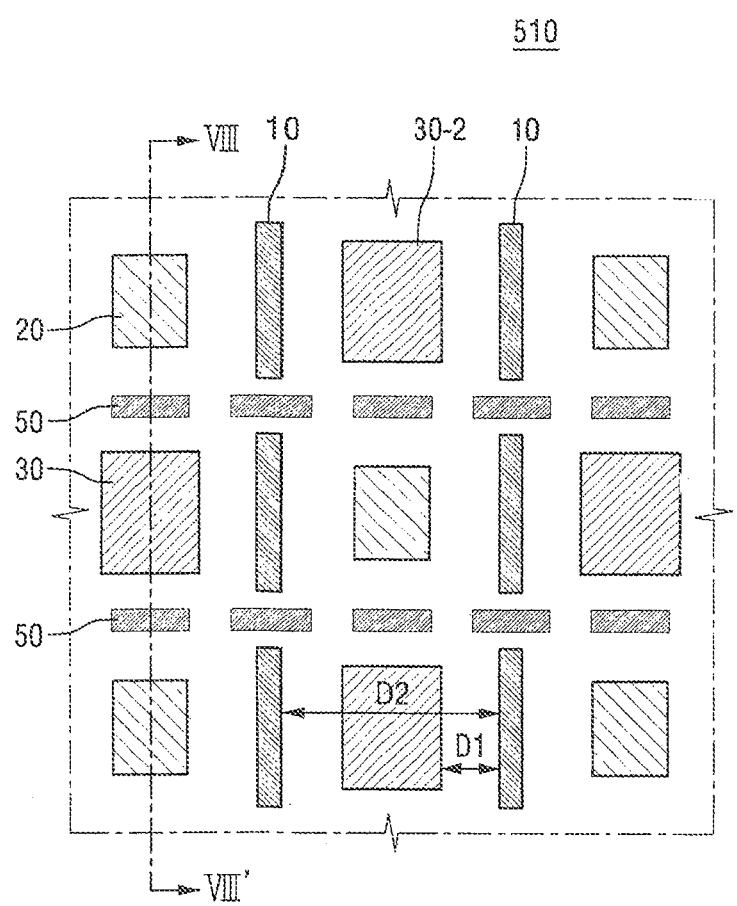
FIG. 7 is a layout view of an organic light-emitting display device constructed as another exemplary embodiment according to the principles of the present invention.
Figure 8:
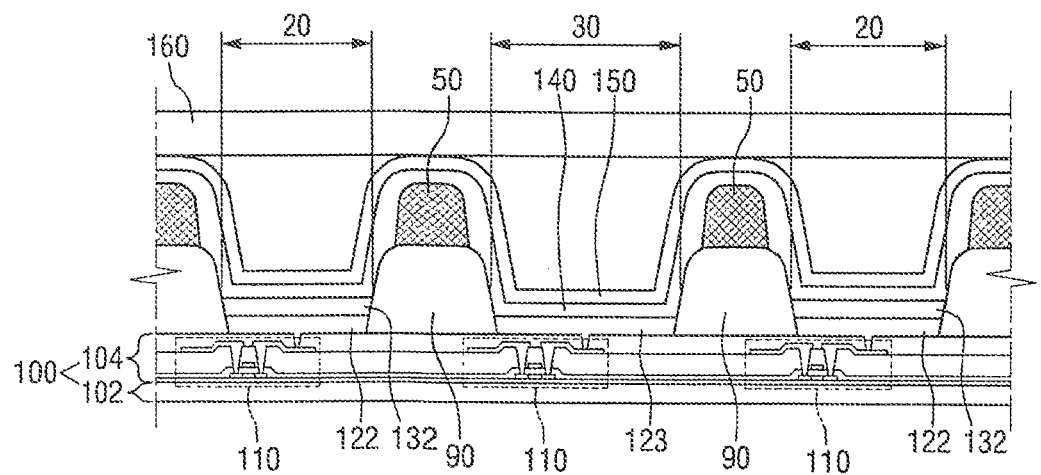
FIG. 8 is a cross-sectional view of the organic light-emitting display device of FIG. 7 taken along line VIII-VIII' of FIG. 7.

FIG. 7 is a layout view of an organic light-emitting display device 510 constructed as another exemplary embodiment according to the principles of the present invention. FIG. 8 is a cross-sectional view taken along line VIII-VIII' of FIG. 7.

Referring to FIGS. 7 and 8, the organic light-emitting display device 510 constructed as the current exemplary embodiment may include a plurality of spacers 50 in addition to elements included in the organic light-emitting display device 500 constructed as the previous exemplary embodiment.

The spacers 50 separate a first substrate 100 from a second substrate 160. In some embodiments of the present invention, the spacers 50 may be interposed between a plurality of pixels in a column direction, that is, between first pixel regions 10 in the column direction, and between second pixel regions 20 and third pixel regions 30 in the column direction.

The spacers 50 are formed on a pixel defined layer 90, and the pixel defined layer 90 and the spacers 50 may be integrally formed of a photosensitive material by a photographic process or a photolithographic process. That is, the pixel defined layer 90 and the spacers 50 may be formed together by adjusting the amount of exposure using a halftone exposure process. However, the present invention is not limited thereto. The pixel defined layer 90 and the spacers 50 can also be sequentially or separately formed and can be independent structures made of different materials.

The organic light-emitting display device 510 constructed as the current exemplary embodiment includes the spacers 50 respectively on both sides of each of the third pixel regions 30 in the column direction. In this case, a higher barrier may be formed between each of the third pixel regions 30 and one of the second pixel regions 20 which is adjacent to the third pixel region 30 in the column direction than when only the pixel defined layer 90 but no spacer 50 exists between them. Therefore, when a second organic layer 132 is deposited, the probability that the second organic layer 132 will intrude into the region of each of the third pixel regions 30 is reduced, thereby reducing the pixel defect rate.

Figure 9:
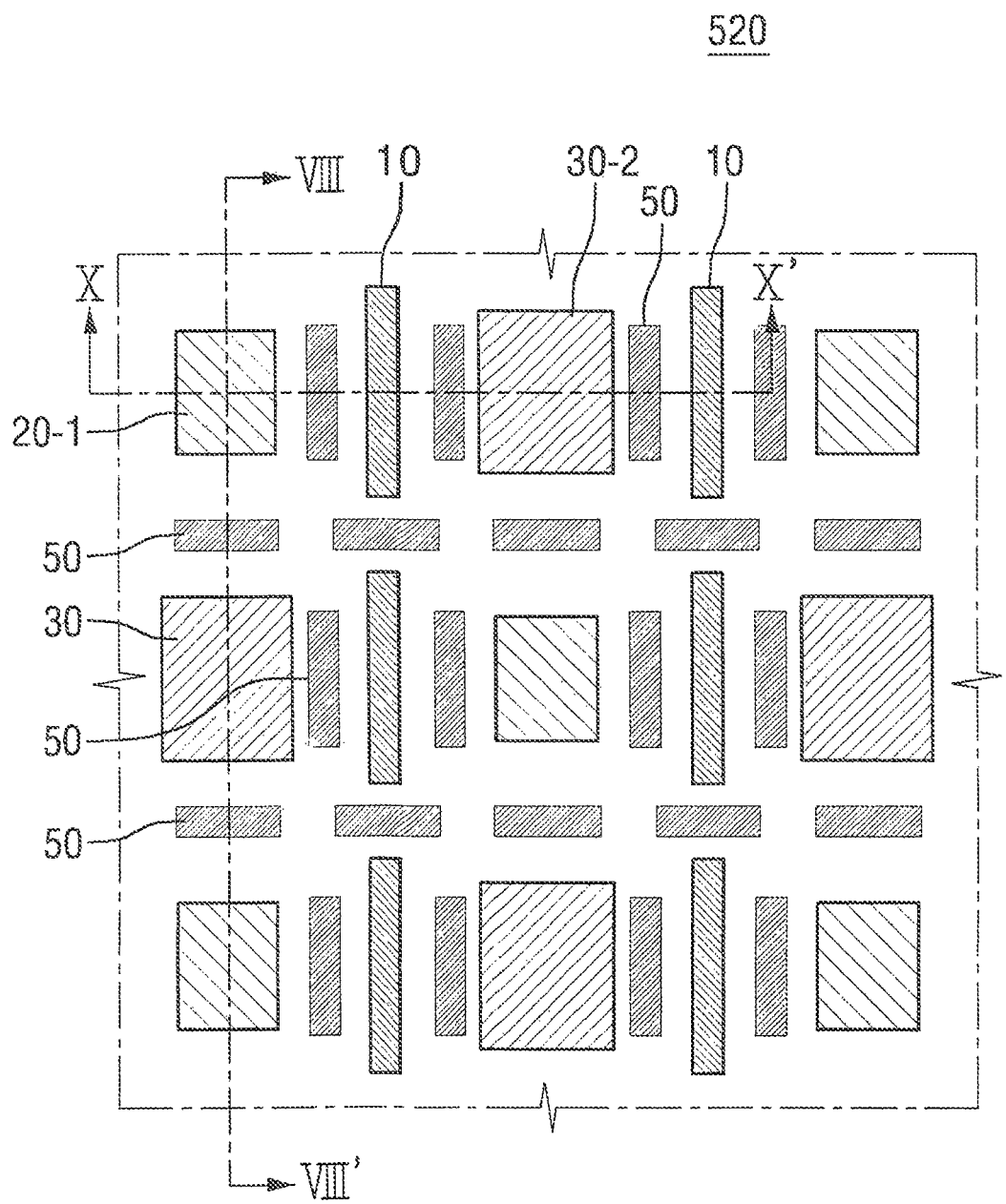
FIG. 9 is a layout view of an organic light-emitting display device constructed as another exemplary embodiment according to the principles of the present invention.
Figure 10:
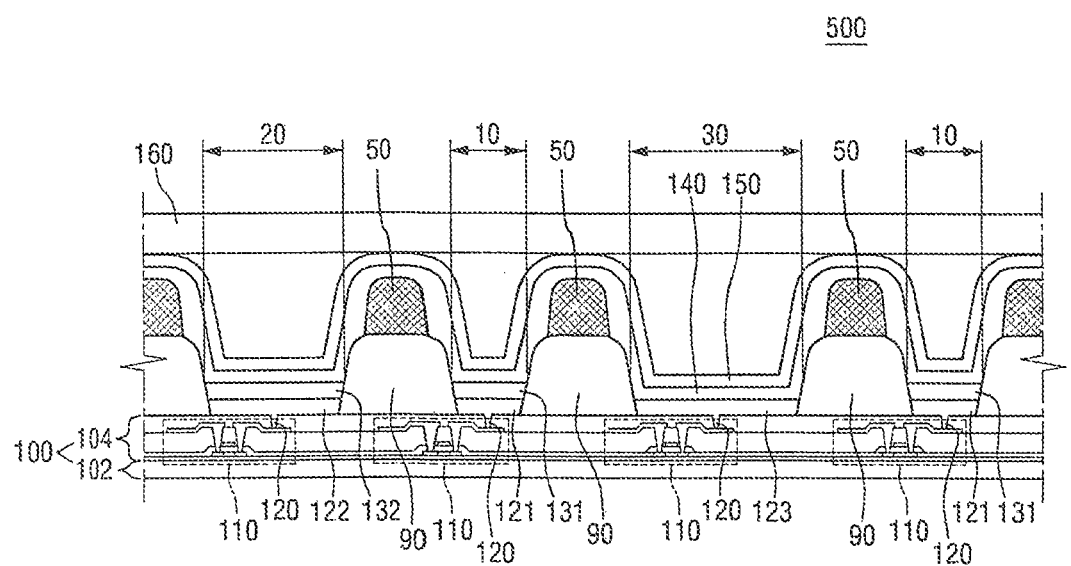
FIG. 10 is a cross-sectional view of the organic light-emitting display device of FIG. 9 taken along line X-X' of FIG. 9.

FIG. 9 is a layout view of an organic light-emitting display device 520 constructed as another exemplary embodiment according to the principles of the present invention. FIG. 10 is a cross-sectional view taken along line X-X' of FIG. 9.

Referring to FIGS. 9 and 10, the organic light-emitting display device 520 constructed as the current exemplary embodiment may include spacers 50 arranged in a row direction of a plurality of pixels, in addition to elements included in the organic light-emitting display device 510 according to the previous exemplary embodiment of FIG. 7.

The organic light-emitting display device 520 constructed as the current exemplary embodiment includes the spacers 50 respectively on both sides of each of third pixel regions 30 not only in a column direction but also in a row direction. In this case, a higher barrier may be formed between each of the third pixel regions 30 and one of first pixel regions 10 which is adjacent to the third pixel region 30 in the row direction than when only a pixel defined layer 90 but no spacer 50 exists between them. Therefore, when a first organic layer 131 is deposited, the probability that the first organic layer 131 will intrude into the region of each of the third pixel regions 30 is reduced, thereby reducing the pixel defect rate.

Figure 11:
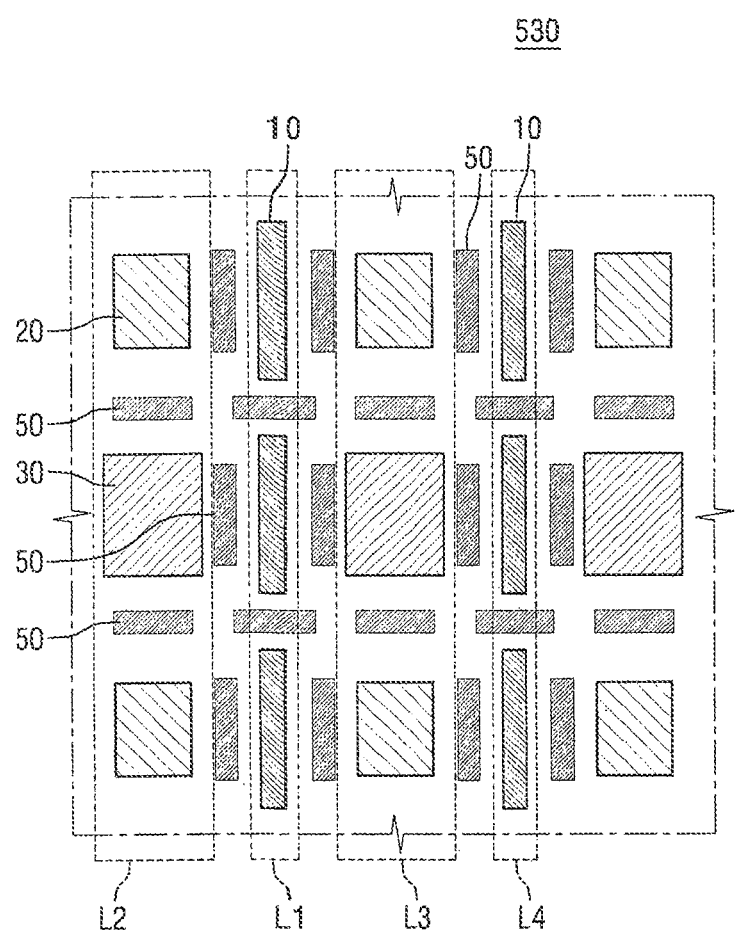
FIG. 11 is a layout view of an organic, light-emitting display device constructed as another exemplary embodiment according to the principles of the present invention.

FIG. 11 is a layout view of an organic light-emitting display device 530 constructed as another exemplary embodiment according to the principles of the present invention.

The organic light-emitting display device 530 constructed as the current exemplary embodiment of the present invention includes a first pixel column L1 and second and third pixel columns L2 and L3 which are disposed respectively on both sides of the first pixel column L1 in a row direction. The first pixel column L1 and the fourth pixel column L4 may include the first pixel regions 10 arranged successively. The second pixel column L2 and the third pixel column L3 may include the second pixel regions 20 and the third pixel regions 30 arranged alternately, and in the same order. In addition, spacers 50 may be interposed between third pixel regions 30 and second pixel regions 20 and may further be interposed between the third pixel regions 30 and first pixel regions 10.

As in the organic light-emitting display devices 500 through 520 in the previous exemplary embodiments, in the organic light-emitting display device 530 according to the current exemplary embodiment, the distance between each of the third pixel regions 30 and one of the second pixel regions 20 which neighbors the third pixel region 30 in a column direction and the distance between each of the third pixel regions 30 and one of the first pixel regions 10 which neighbors the third pixel region 30 in the row direction are greater than those in a conventional display device. Accordingly, when an organic layer is deposited in each of the first pixel regions 10 or each of the second pixel regions 20, the probability that the organic layer will intrude into each of the third pixel regions 30 is reduced, thereby reducing the pixel defect rate.

In addition, the organic light-emitting display device 530 constructed as the current exemplary embodiment includes the spacers 50 in the row and column directions of a plurality of pixels. In this case, a higher barrier may be formed between the pixels than when only a pixel defined layer 90 but no spacer 50 exists between them. Therefore, when an organic layer is deposited in each of the first pixel regions 10 or each of the second pixel regions 20, the probability that the organic layer will intrude into each of the third pixel regions 30 is reduced, thereby reducing the pixel defect rate.

More details of the organic light-emitting display devices according to the above-described embodiments and other various embodiments will be described, together with a method of manufacturing an organic light-emitting display device as exemplary embodiments according to the principles of the present invention.

FIGS. 12A, 13A, 14A, 15A and 16A are layout views sequentially illustrating processes in a method of manufacturing an organic light-emitting display device as an exemplary embodiment according to the principles of the present invention. FIGS. 12B, 13B, 14B, 15B and 16B are cross-sectional views respectively taken along line XIIb-XIIb' of FIG. 12A, line XIIIb-XIIIb' of FIG. 13A, line XIVb-XIVb' of FIG. 14A, line XVb-XVb' of FIG. 15A, and line XVIb-XVIb' of FIG. 16A. An exemplary method of manufacturing an organic light-emitting display device is illustrated in these drawings.

Figure 12A:
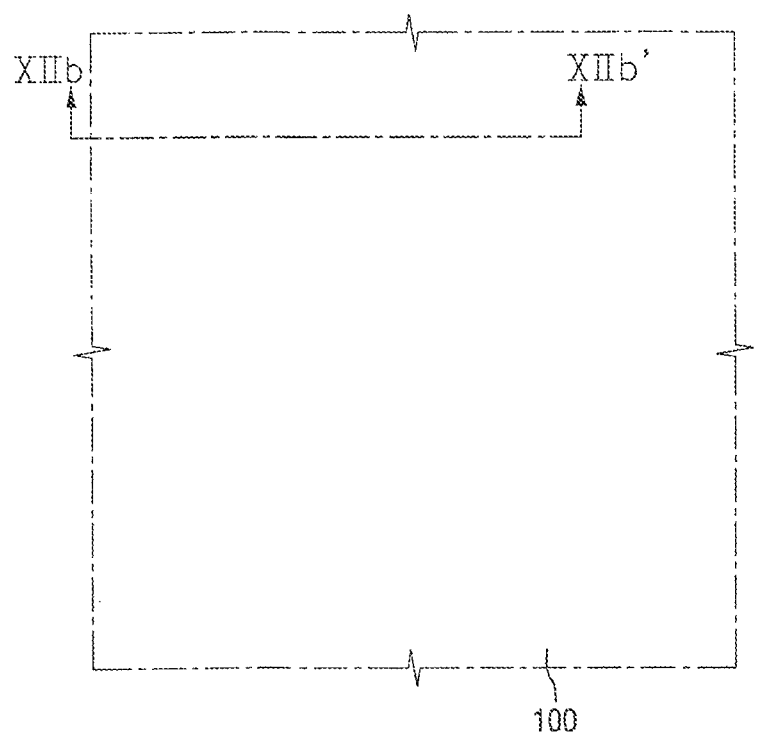
FIGS. 12A, 13A, 14A, 15A and 16A are layout views sequentially illustrating processes in a method of manufacturing an organic light-emitting display device as an exemplary embodiment according to the principles of the present invention.
Figure 12B:
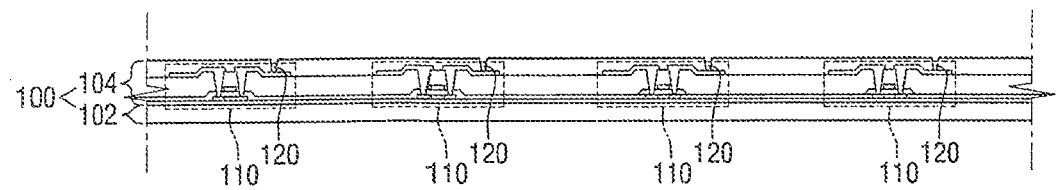
FIG. 12B is a cross-sectional view of the organic light-emitting display device of FIG. 12A taken along line XIIb-XIIb' of FIG. 12A.

Referring to FIGS. 12A and 12B, a first substrate 100 is prepared. The preparing of the first substrate 100 may include forming a plurality of pixel driving portions 110, which are included in a driving element layer 104, on a first insulating substrate 102.

Figure 13A:
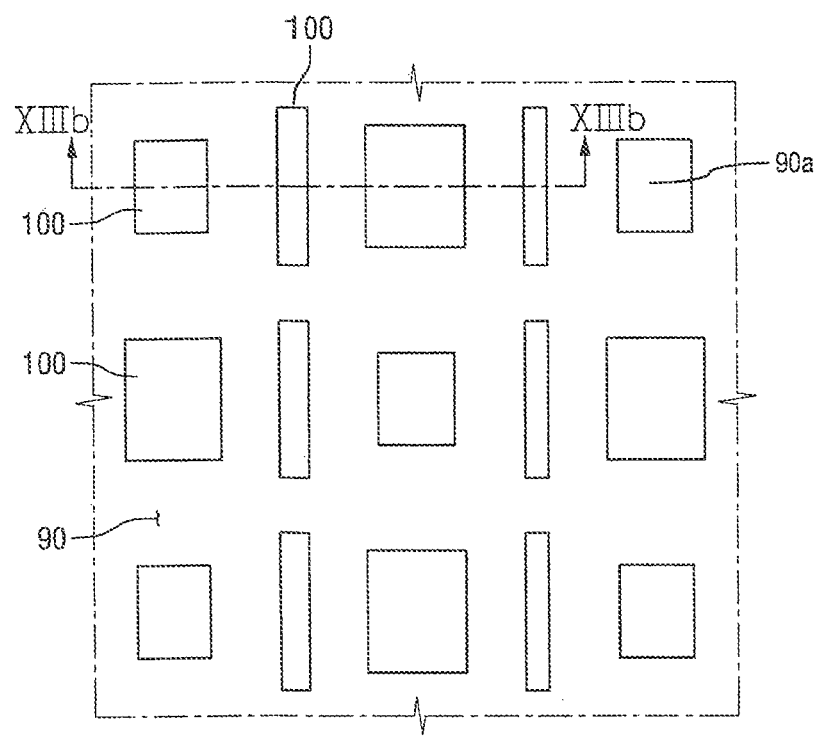
Figure 13B:
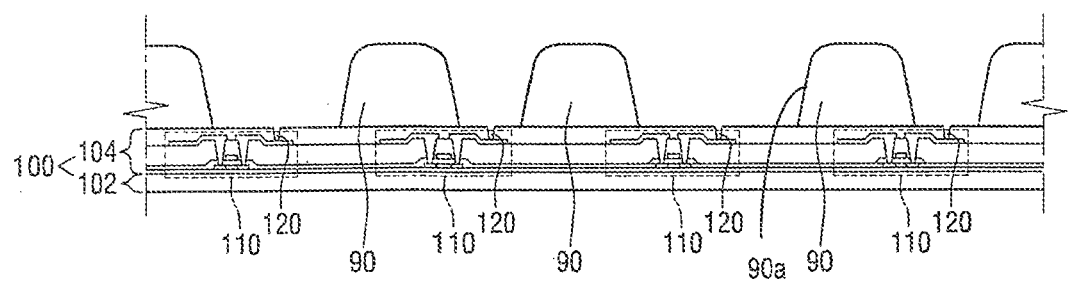
FIG. 13B is a cross-sectional view of the organic light-emitting display device of FIG. 13A taken along line XIIIb-XIIIb' of FIG. 13A.

Referring to FIGS. 13A and 13B, a pixel defined layer 90 including a plurality of apertures 90a arranged in a matrix is formed on the first substrate 100. In some other embodiments of the present invention, a process of forming spacers on the pixel defined layer 90 may further be performed.

Figure 14A:
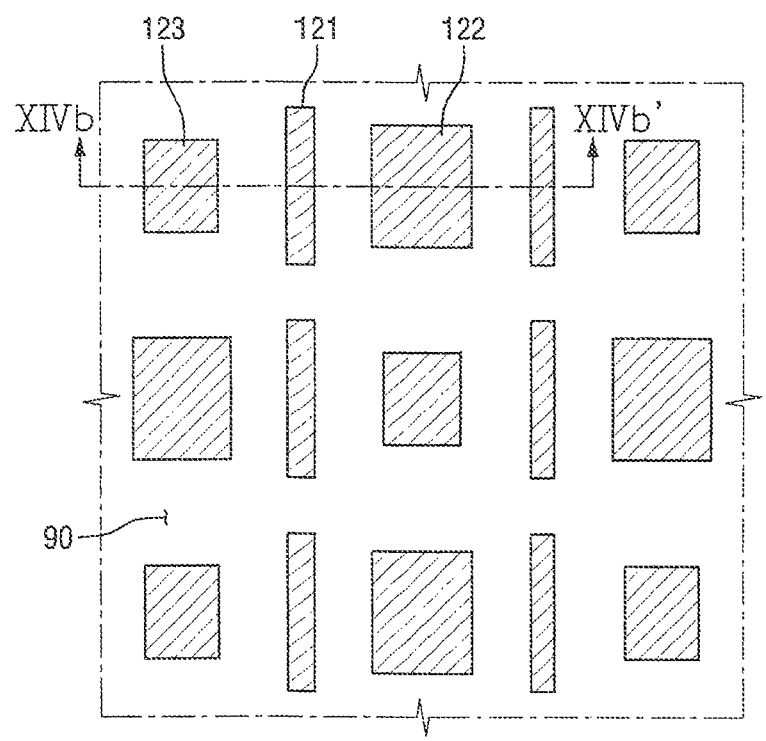
Figure 14B:
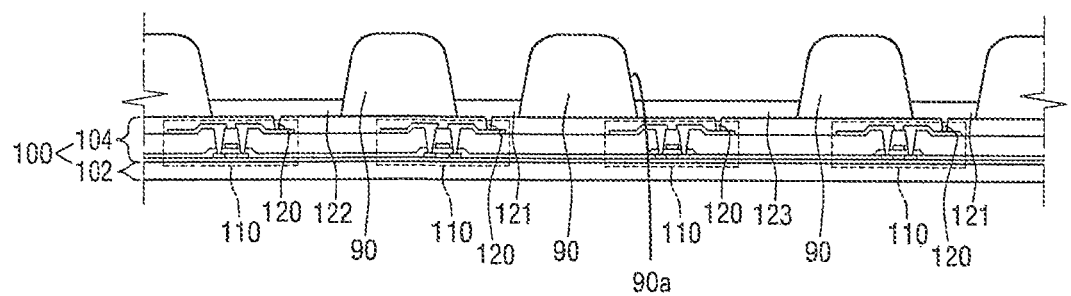
FIG. 14B is a cross-sectional view of the organic light-emitting display device of FIG. 14A taken along line XIVb-XIVb' of FIG. 14A.

Referring to FIGS. 14A and 14B, first through third pixel electrodes 121 through 123 are formed in the apertures 90a of the pixel defined layer 90. Each of the first pixel electrodes 121 may neighbor one of the second pixel electrodes 122 on a side thereof in a row direction and may neighbor one of the third pixel electrodes 123 on the other side thereof in the row direction. In addition, each of the first pixel electrodes 121 may neighbor different first pixel electrodes 121 respectively on both sides thereof in a column direction. Each of the second pixel electrodes 122 may neighbor the first pixel electrodes 121 respectively on both sides thereof in the row direction and may neighbor the third pixel electrodes 123 respectively on both sides thereof in the column direction. Each of the third pixel electrodes 123 may neighbor the first pixel electrodes 121 respectively on both sides thereof in the row direction and may neighbor the second pixel electrodes 122 respectively on both sides thereof in the column direction.

Figure 15A:
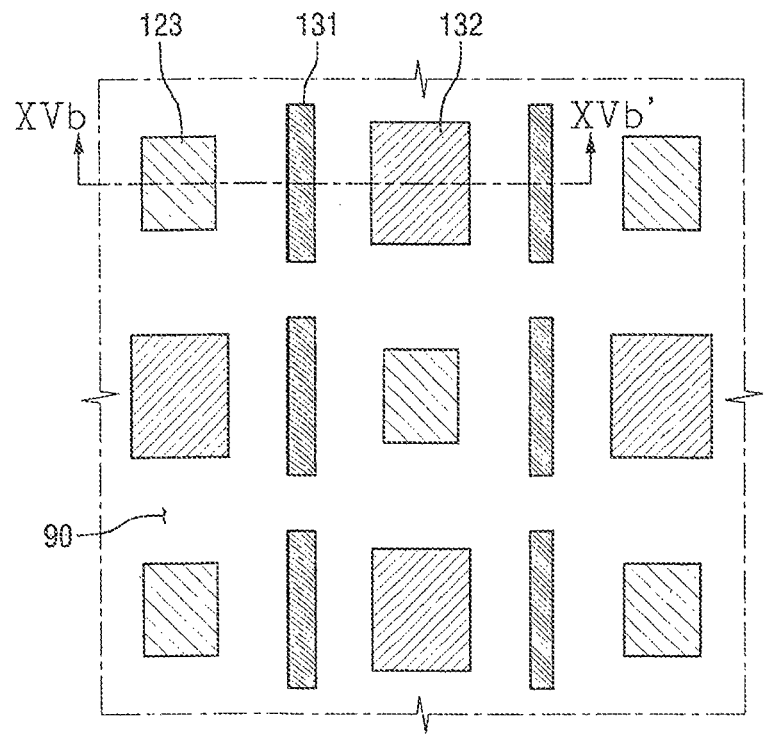
Figure 15B:
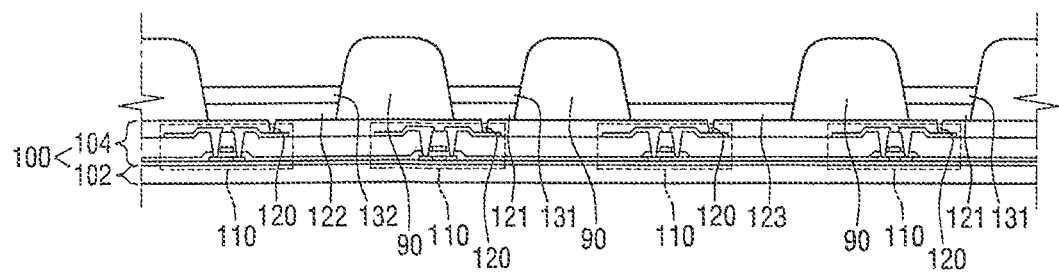
FIG. 15B is a cross-sectional view of the organic light-emitting display device of FIG. 15A taken along line XVb-XVb' of FIG. 15A.

Referring to FIGS. 15A and 15B, a first organic layer 131 and a second organic layer 132 are formed by deposition processes. The first organic layer 131 and the second organic layer 132 may be deposited using separate fine metal masks. The first organic layer 131 and the second organic layer 132 may be sequentially formed in this order or in the reverse order.

Figure 16A:
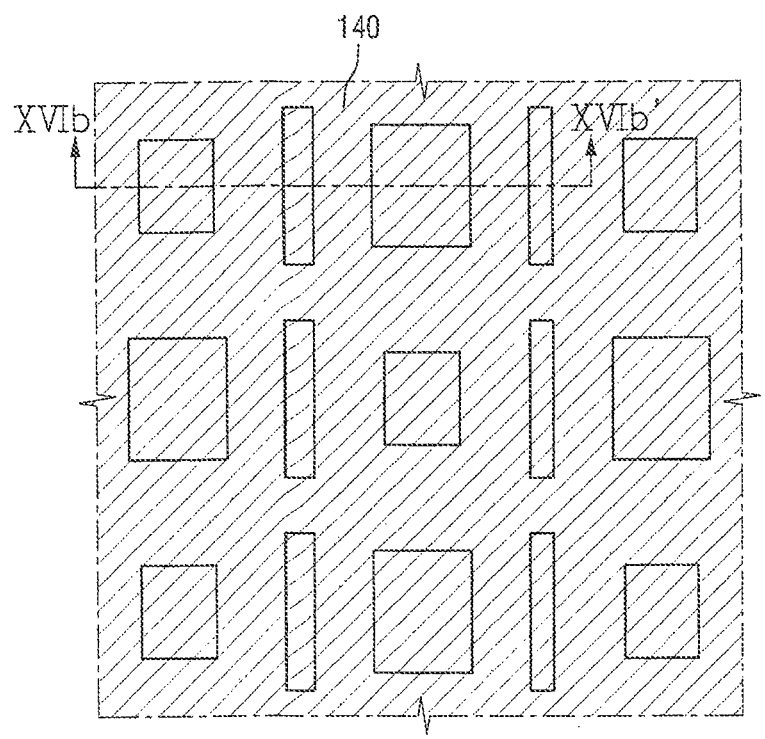
Figure 16B:
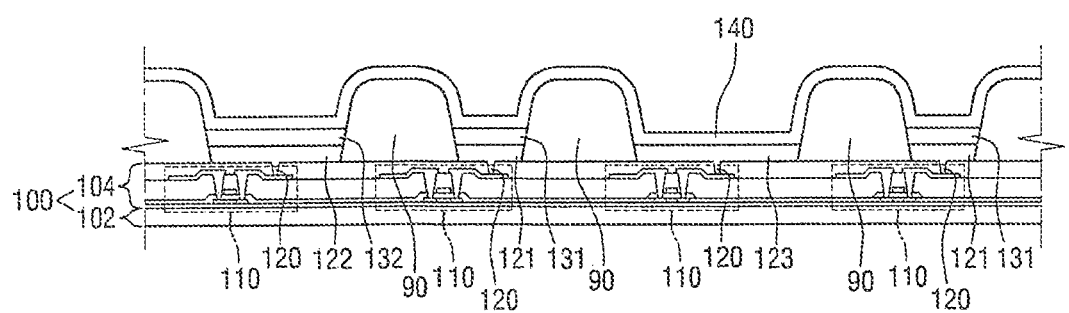
FIG. 16B is a cross-sectional view of the organic light-emitting display device of FIG. 16A taken along line XVIb-XVIb' of FIG. 16A.

Referring to FIGS. 16A and 16B, a third organic layer 140 is formed on the first organic layer 131 and the second organic layer 132 as a common layer. The third organic layer 140 may be deposited, as an organic common layer, on the whole surface of the first substrate 100 having the first and second organic layers 131 and 132 without using a fine metal mask.

Then, a common electrode 150 is formed on the third organic layer 133 as a common layer.

Finally, a second substrate 160 is placed on the common electrode 150. The second substrate 160 may be placed on the common electrode 150 to face the first substrate 100. The placing of the second substrate 160 may include sealing and bonding the first substrate 100 and the second substrate 160 together using a sealing member (not shown), thereby preventing external air from getting into the first organic layer 131, the second organic layer 132, and the third organic layer 140.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An organic light-emitting display device, comprising:
a substrate;
a plurality of pixel electrodes arranged in a matrix on the substrate; and
an organic common layer covering the pixel electrodes,
the pixel electrodes comprise a plurality of first pixel electrodes, a plurality of second pixel electrodes, and a plurality of third pixel electrodes,
an n-th pixel column comprises the second pixel electrodes and the third pixel electrodes arranged alternately, an (n+1)-th pixel column which is adjacent to the n-th pixel column comprises the first pixel electrodes, and an (n+2)-th pixel column which is adjacent to the (n+1)-th pixel column comprises the second pixel electrodes and the third pixel electrodes arranged alternately, wherein n is a natural number,
one of the second and third pixel electrodes is disposed in the n-th pixel column in a row and the other one of the second and third pixel electrodes is disposed in the (n+2)-th pixel column in the same row, and
in regions of the organic common layer which overlap the third pixel electrodes, the organic common layer emits light, and
in regions of the organic common layer which overlap the first pixel electrodes and the second pixel electrodes, the organic common layer does not emit light.

2. The display device of claim 1, further comprising a plurality of pixel regions arranged in a matrix,
the pixel regions comprise a plurality of first pixel regions which display a first color, a plurality of second pixel regions which display a second color different from the first color, and a plurality of third pixel regions which display a third color different from the second color, and
the first pixel electrodes are respectively disposed in the first pixel regions, the second pixel electrodes are respectively disposed in the second pixel regions, and the third pixel electrodes are respectively disposed in the third pixel regions.

3. The display device of claim 1, wherein regions of the organic common layer which overlap the third pixel electrodes emit blue light.

4. The display device of claim 1, further comprising a first organic layer between each of the first pixel electrodes and the organic common layer and a second organic layer between each of the second pixel electrodes and the organic common layer.

5. The display device of claim 4, wherein the first organic layer emits green light, and the second organic layer emits red light.

6. The display device of claim 4, wherein the first organic layer emits red light, and the second organic layer emits green light.

7. The display device of claim 1, wherein a distance between each of the second pixel electrodes and one of the third pixel electrodes which neighbors the second pixel electrode is larger than a distance between each of the third pixel electrodes and one of the first pixel electrodes which neighbors the third pixel electrode in a row direction.

8. The display device of claim 1, further comprising spacers formed on regions of the substrate between the second pixel electrodes and the third pixel electrodes.

9. The display device of claim 1, further comprising spacers formed on regions of the substrate between the second pixel electrodes and the first pixel electrodes.

10. The display device of claim 1, further comprising spacers formed on regions of the substrate between the third pixel electrodes and the first pixel electrodes.

11. The display device of claim 1, further comprising first spacers formed on the regions of the substrate between the second pixel electrodes and the third pixel electrodes, second spacers formed on the regions of the substrate between the second pixel electrodes and the first pixel electrodes, and third spacers formed on the regions of the substrate between the third pixel electrodes and the first pixel electrodes.

12. The display device of claim 1, wherein the first organic layer emits green light, and the second organic layer emits red light.

13. The display device of claim 1, further comprising a pixel defined layer disposed on the substrate and comprising a plurality of apertures arranged in a matrix, wherein the pixel electrodes are formed in the apertures on the substrate.

14. An organic light-emitting display device comprising:
a substrate;
a plurality of pixel electrodes arranged in a matrix on the substrate; and
an organic common layer disposed on the substrate and covering the pixel electrodes,
the pixel electrodes comprise a plurality of first pixel electrodes, a plurality of second pixel electrodes, and a plurality of third pixel electrodes,
an n-th pixel column comprises the second pixel electrodes and the third pixel electrodes arranged alternately, an (n+1)-th pixel column which is adjacent to the n-th pixel column comprises the first pixel electrodes, and an (n+2)-th pixel column which is adjacent to the (n+1)-th pixel column comprises the second pixel electrodes and the third pixel electrodes arranged alternately, wherein n is a natural number,
one of the second and third pixel electrodes is disposed in the n-th pixel column in a row and the other one of the second and third pixel electrodes is disposed in the (n+2)-th pixel column in the same row,
in regions of the organic common layer which overlap the third pixel electrodes, the organic common layer emits light.
in regions of the organic common layer which overlap the first pixel electrodes and the second pixel electrodes, the organic common layer does not emit light, and
the organic common layer comprises a plurality of protruding patterns which protrude toward the substrate, and the protruding patterns comprise a first protruding pattern and second through fifth protruding patterns which are located an equal distance from the first protruding pattern.

15. The display device of claim 14, wherein the second through fifth protruding patterns are sequentially arranged in a clockwise direction with respect to the first protruding pattern, the second protruding pattern, the first protruding pattern and the fourth protruding pattern are located in a straight line, and the third protruding pattern, the first protruding pattern and the fifth protruding pattern are located in another straight line.

16. The display device of claim 14, wherein the protruding patterns emit light.

17. The display device of claim 14, wherein the protruding patterns emit blue light.

18. A method of manufacturing an organic light-emitting display device, the method comprising:
preparing a substrate;
forming a pixel defined layer, which comprises a plurality of apertures arranged in a matrix, on the substrate;
placing first through third pixel electrodes in the apertures on the substrate;
forming a first organic layer on each of the first pixel electrodes;
forming a second organic layer on each of the second pixel electrodes;
forming an organic common layer on the first organic layer, the second organic layer and each of the third pixel electrodes as a common layer; and
forming a common electrode on the organic common layer,
an n-th pixel column comprises the second pixel electrodes and the third pixel electrodes arranged alternately, an (n+1)-th pixel column which is adjacent to the n-th pixel column comprises the first pixel electrodes, and an (n+2)-th pixel column which is adjacent to the (n+1)-th pixel column comprises the second pixel electrodes and the third pixel electrodes arranged alternately, wherein n is a natural number,
any one of the second and third pixel electrodes is disposed in the n-th pixel column in a row and the other one of the second and third pixel electrodes is disposed in the (n+2)-th pixel column in the same row, and
in regions of the organic common layer which overlap the third pixel electrodes, the organic common layer emits light, and
in regions of the organic common layer which overlap the first pixel electrodes and the second pixel electrodes, the organic common layer does not emit light.

19. The method of claim 18, wherein the forming of the pixel defined layer, which comprises the apertures arranged in the matrix, on the substrate comprises forming one or more spacers which protrude from a top surface of the pixel defined layer.

* * * * *